United States Patent [19]

Ohmuro et al.

[11] Patent Number: 4,905,061

[45] Date of Patent: Feb. 27, 1990

[54] SCHOTTKY GATE FIELD EFFECT TRANSISTOR

[75] Inventors: Kazuhiko Ohmuro; Hiroshi Nakamura, both of Tokyo, Japan

[73] Assignee: Oki Electric Industry Co., Ltd., Tokyo, Japan

[21] Appl. No.: 253,214

[22] Filed: Oct. 4, 1988

[30] Foreign Application Priority Data

Oct. 9, 1987 [JP] Japan ................ 62-253542

[51] Int. Cl.$^4$ ........................... H01L 29/80
[52] U.S. Cl. ................... 357/22; 357/23.2; 357/64; 357/91
[58] Field of Search ........ 357/23.2, 22 A, 22 I, 357/22 K, 91, 64

[56] References Cited

U.S. PATENT DOCUMENTS

| | | | |
|---|---|---|---|
| 3,700,978 | 10/1972 | North | 357/23.2 |
| 4,193,079 | 3/1980 | Yeh | 357/22 |
| 4,306,916 | 12/1981 | Wollesen et al. | 148/1.5 |
| 4,469,528 | 9/1984 | Berth et al. | 148/1.5 |
| 4,601,095 | 7/1986 | Kikuchi et al. | 29/571 |

FOREIGN PATENT DOCUMENTS

| | | |
|---|---|---|
| 0013340 | 7/1980 | European Pat. Off. |
| 0092266 | 10/1983 | European Pat. Off. |
| 0112657 | 7/1984 | European Pat. Off. |
| 2433839 | 6/1975 | Fed. Rep. of Germany |
| 2543654 | 6/1978 | Fed. Rep. of Germany |
| 2425382 | 12/1983 | Fed. Rep. of Germany |
| 6054479 | 3/1985 | Japan ................ 357/64 |
| 2046993 | 11/1980 | United Kingdom |

OTHER PUBLICATIONS

JP-Z Japanese Journal of Applied Physics, Asano et al., vol. 20, No. 5, May 1981, pp. 901–907.
GB-Z Solid-State Electronics, vol. 11, 1968, p. 601.
U.S.-Z IEEE Transactions on Electronic Devices, vol. ED-29, No. 5, May 1982, pp. 811–813.
U.S.-Z IEEE Electron Device Letters, vol. EDL-5, No. 4, Apr. 1984, pp. 126–128.
Extended Abstracts of the 16th (1984 Int.) Conf. on Solid State Devices and Material, Kobe, Nakamura et al., 1984, pp. 395–398.

Primary Examiner—Andrew J. James
Assistant Examiner—David Soltz
Attorney, Agent, or Firm—Wenderoth, Lind & Ponack

[57] ABSTRACT

In a Schottky gate field effect transistor comprising a channel formed by doping donor ions in the surface layer of a compound semiconductor (e.g., GaAs) substrate and performing heat treatment, a Schottky gate electrode formed over the channel, and a source electrode and a drain electrode formed on the respective sides of the Schottky gate electrode, a first and a second regions are formed by implantation of ions which are to become carrier killers, to have respective concentration peaks shallower and deeper than the concentration peak of the donor ions of the channel.

3 Claims, 3 Drawing Sheets

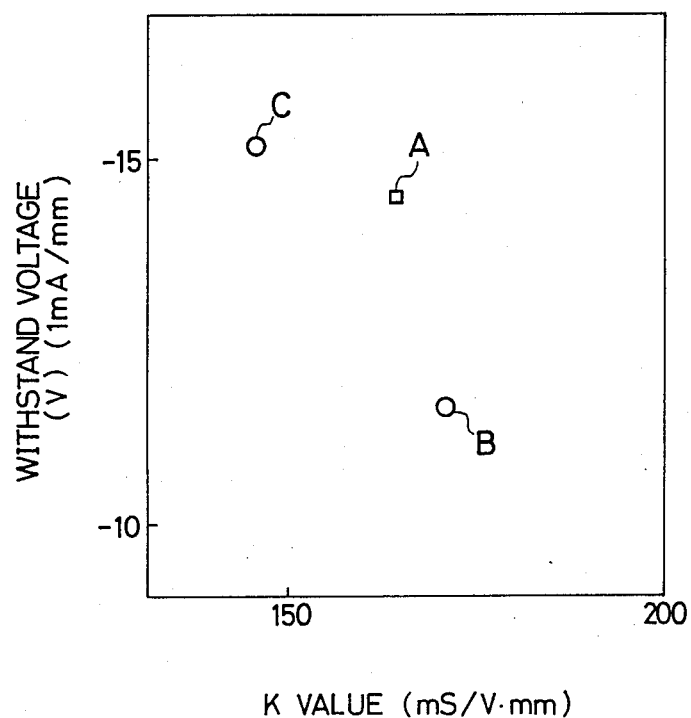

SCHOTTKY GATE FIELD EFFECT TRANSISTOR

BACKGROUND OF THE INVENTION

The present invention relates to a Schottky gate field effect transistor (hereinafter referred to as MESFET) formed on a compound semiconductor substrate, such as a GaAs substrate.

In general, GaAs MESFET comprises GaAs a channel formed by doping donor ions such as Si ions in a surface layer of a GaAs substrate and performing heat treatment, a Schottky gate electrode formed on the channel, and a source region and a drain region adjacent the channel, a source electrode and a drain electrode formed over the source region and the drain region and on the respective sides of the Schottky gate electrode. To improve the K value (its definition being given hereinbelow) and gm (mutual conductance) in a conventional MESFET, ion implantation is performed with a low energy and a high-concentration to form a channel, or as described in the Extended Abstract of the 16th (1984 International) Conference on Solid State Devices and Materials, Kobe, 1984, pp. 395-398, ions, such as C ions and O ions, which will become carrier killers are implanted at a high energy to kill carriers at a deep part of the channel thereby forming a channel having a steep profile.

The MESFET of these structures can have improved K value and mutual conductance gm, but there is an attendant effect that the dielectric breakdown voltage (withstand voltage) is degraded.

SUMMARY OF THE INVENTION

An object of the invention is to provide a MESFET with improved K value, mutual conductance gm and withstand voltage.

A MESFET according to the invention is characterized by
a channel formed by implanting donor ions in a surface layer of a compound semiconductor substrate and performing heat treatment, and regions in which carrier killers are doped and which have respective concentration peaks at parts shallower and deeper than the concentration peak of the channel.

Because of the carrier killers, the electron concentration can be reduced at parts other than in the region in which the concentration peak of the channel exists. Accordingly, the carrier profile of the channel can be made steeper.

BRIEF DESCRIPTION OF THE DRAWINGS

FIG. 2 is a diagram showing the withstand voltage of the MESFET and the K value.

DETAILED DESCRIPTION OF THE EMBODIMENTS

Figure 1A:
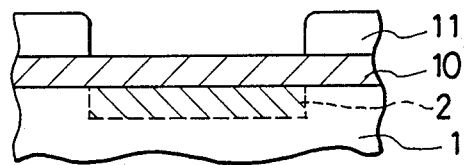
FIG. 1A through FIG. 1D are cross sectional views showing the respective steps of fabrication of a MESFET of an embodiment of the invention.
Figure 1B:
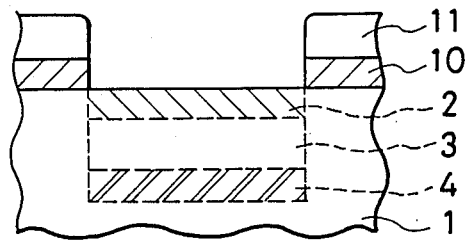
Figure 1C:
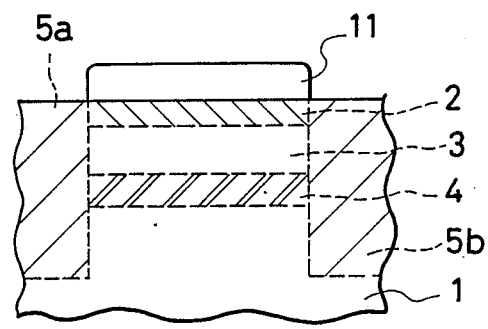
Figure 1D:
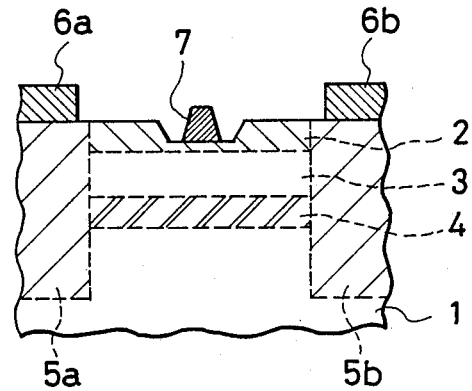

As shown in FIG. 1D, a MESFET according to the invention comprises a compound semiconductor substrate, such as a GaAs substrate 1, a channel 3 formed by implanting donor ions in the surface layer of the substrate 1 and performing heat treatment, a first region 2 formed by implantation of ions which are to become carrier killers and having a concentration peak at a part shallower than the concentration peak of the donor ions of the channel 3, a second region 4 formed by implantation of ions which are to become carrier killers and having a concentration peak at a part deeper than the concentration peak of the donor ions of the channel 3, a source region 5a and a drain region 5b formed on the respective sides of and adjacent to the channel 3, a source electrode 6a and a drain electrode 6b formed on the respective sides of the Schottky gate electrode and over the source and drain regions 5a and 5b, and a Schottky gate electrode formed on the channel.

The MESFET shown in FIG. 1D can be fabricated in a manner shown in FIG. 1A through FIG. 1C. First as shown in FIG. 1A, an SiN film 10 is deposited to a thickness of about 1000 Å on a GaAs substrate 1. Then a resist 11 is used as a mask to ion-implant C (carbon) through the SiN film 10 into the part of the GaAs substrate 1 which is to become the channel, at an implantation energy of 50 keV, with a dose of $2 \times 10^{12}/cm^2$ to form a first region 2. The SiN film 10 over the region which is to become the channel is removed, and, as shown in FIG. 1B, Si (silicon) ions are implanted directly into the GaAs substrate 1 at an implantation energy of about 60 keV and with a dose of about $7 \times 10^{12}/cm^2$, and C (carbon) ions are then implanted at an implantation energy of about 80 keV and with a dose of about $1 \times 10^{12}$ to form the n-type channel 3 and the second region 4, respectively.

The resultant structure will be as shown in FIG. 1B. As will be seen from FIG. 1B, the electron concentration at the surface has been reduced because of the carbon (C) in the first region 2 implanted into the surface of the GaAs substrate 1, and the part having a high electron concentration is narrowed because of the carbon (C) in the second region 4 implanted into the deep part of the channel 3, so that the carrier profile of the channel can be made steep.

Then the remaining SiN film 10 and resist 11 are removed, and then, as shown in FIG. 1C, a resist 12 is formed on the part of the GaAs substrate 1 which is to become the channel, and is used as a mask to ion-implant silicon (Si) with a high concentration, thereby to form n+-type source region 5a and drain region 5b. Then, an SiO$_2$ film, not shown, is deposited throughout the GaAs substrate 1 and heat treatment is performed at about 800° C. to activate the regions in which ions have been implanted. The SiO$_2$ film serves to prevent evaporation of As during the heat treatment.

Then, as shown in FIG. 1D, the SiO$_2$ film, not shown, is removed. Subsequently, the lift-off process is used to deposit AuGe, Ni, and Au films, in the stated order, as ohmic metal on the source region 5a and the drain region 5b thereby to form the source electrode 6a and the drain electrode 6b. After that, the gate part of the first region 2 is subjected to recess-etching to a depth of up to about 400 Å. The recess etching may be a wet etching using an acid as an etchant. Then, aluminum (Al) is deposited and pattern-formed on the recess-etched part to a thickness of about 4000 Å thereby to form a Schottky gate electrode 7. This completes the process of fabricating a MESFET.

Figure 4A:
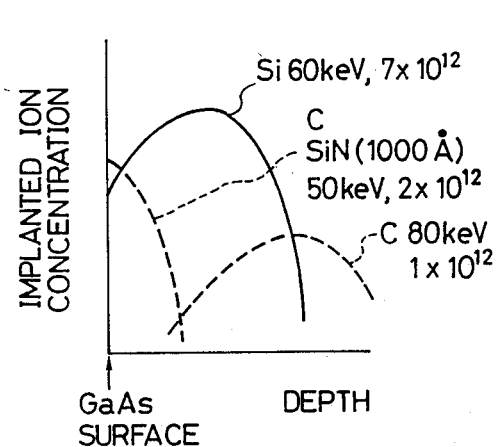
FIG. 4A and FIG. 4B are diagrams showing the carrier profiles in the MESFET of the invention.
Figure 4B:
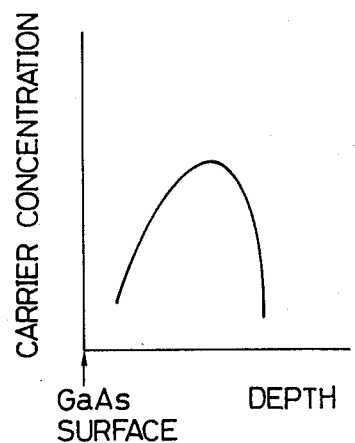

FIG. 4A and FIG. 4B show the carrier profile in the resultant structure. As shown in FIG. 4A, a first region and a second region are formed at a shallow part and at a deep part, respectively, by implantation of ions which are to become carrier killers. Accordingly, the channel will have a steep carrier profile as shown in FIG. 4B. The K value, the mutual conductance gm and the withstand voltage are thereby improved.

FIG. 2 shows the K value and the withstand voltage of the MESFET according to the embodiment of the invention that has been described, in comparison with the MESFETs that do not have features of the invention. The data shown are on the MESFETs having the gate length of 0.6 μm and the gate width of 10 μm. The withstand voltage is defined as the voltage when an electric current of 1 mA per 1 mm of the gate width flows between the gate and the drain.

The K value is defined as follows:

$$K = \epsilon u Z / 2aL$$

where $\epsilon$ denotes the dielectric constant of the channel GaAs, u denotes mobility of the carrier,
a denotes channel thickness,
L denotes gate length, and
Z denotes gate width.

The plot A indicates the result for the MESFET with the implanted carbon (C) in the surface (i.e., having the first region) as well as with the implanted carbon in the deep part (i.e., having the second region): the K value and the withstand voltage are 164.1 mS/V mm and $-14.5$ V, respectively. The plot B indicates the result for the MESFET without the implanted carbon (C) in the surface (i.e., without having the first region) but having the implanted carbond (C) in the deep part (i.e., having the second region): the K value and the withstand voltage are 171.6 mS/V mm and $-11.6$ V, respectively. The plot C indicates the result for the MESFET formed by implantation of silicon (Si) at 60 keV and with a dose of $5 \times 10^{12}$, alone (i.e., without having the first and second regions): the K value and the withstand voltage are 144.3 mS/V mm and $-15.2$ V, respectively. The comparison between the plots A and B shows that the withstand voltage is increased by 3 V without any significant decrease in the K value. The comparison between the plots A and C shows that the K value is increased by 20 mS/V mm without any significant decrease in the withstand voltage.

Figure 3:
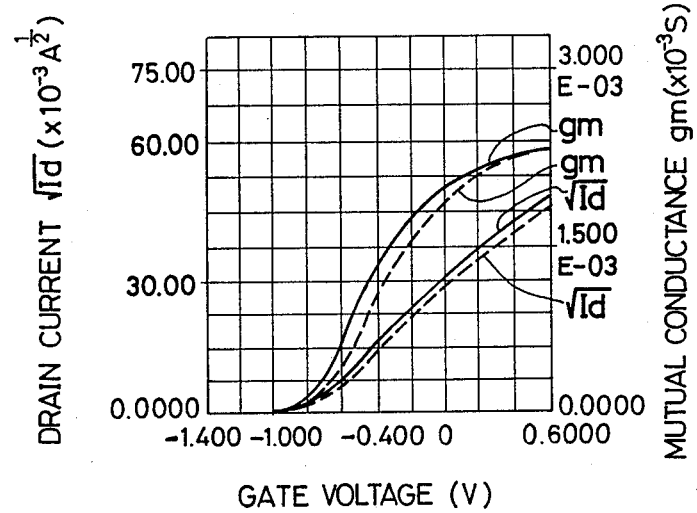
FIG. 3 is a diagram showing a square root of the drain current and the mutual conductance gm versus the gate voltage.

FIG. 3 shows the mutual conductance gm and the drain current in square root $Id^{\frac{1}{2}}$. The solid lines represent characteristics of an embodiment of the invention corresponding to plot A in FIG. 2. The broken lines represent characteristics of a prior art device corresponding to plot C in FIG. 2.

At an operating point, e.g., at a gate voltage of $-0.4$ V and a drain current 225 μA ($Id^{\frac{1}{2}} = 15 \times 10^{-3} A^{\frac{1}{2}}$), the mutual conductance can be improved by about 10%.

In the above embodiments, C ions are used as carrier killers. O (oxygen) ions, B (boron) ions and any other ions which are generally used as carrier killers can also be used in the invention to obtain a similar effect. The MESFET that is described above is of a recess structure. But the invention is applicable to other types of MESFET.

What is claimed is:

1. A Schottky gate field effect transistor comprising:
   a compound semiconductor substrate formed of GaAs;
   a channel formed by ion-implanting Si ions as donor ions in the surface layer of the substrate and performing heat treatment;
   a Schottky gate electrode formed over the channel;
   a source electrode and a drain electrode formed on respective sides of the Schottky gate electrode;
   a first region formed by implantation of C ions which are to become carrier killers and having a concentration peak at a part shallower than the concentration peak of the donor ions of the channel; and
   a second region formed by implantation of C ions which are to become carrier killers and having a concentration peak at a part deeper than the concentration peak of the donor ions of the channel.

2. A transistor according to claim 1, wherein the first region is formed by implantation of C ions at an energy of about 50 keV and with a dose of about $2 \times 10^{12}/cm^2$, and the second region is formed by implantation of C ions at an energy of about 80 keV and with a dose of $1 \times 10^{12}/cm^2$.

3. A transistor acording to claim 2, wherein said channel is formed by implantation of Si ions at an energy of about 60 keV and with a dose of about $7 \times 10^{12}/cm^2$.

* * * * *